(12) United States Patent  
Rhee et al.

(10) Patent No.: US 9,082,947 B2  
(45) Date of Patent: Jul. 14, 2015

(54) DISPLAY DEVICE USING SEMICONDUCTOR LIGHT EMITTING DEVICE

(71) Applicant: LG ELECTRONICS INC., Seoul (KR)

(72) Inventors: Byungjoon Rhee, Seoul (KR); Chisun Kim, Seoul (KR); Eunhye Kim, Seoul (KR); Kyuhyun Bang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/506,294

(22) Filed: Oct. 3, 2014

(65) Prior Publication Data  
US 2015/0115296 A1   Apr. 30, 2015

(30) Foreign Application Priority Data  
Oct. 24, 2013 (KR) .......................... 10-2013-0127354

(51) Int. Cl.  
*H01L 33/62* (2010.01)  
*H01L 27/15* (2006.01)

(52) U.S. Cl.  
CPC .............. *H01L 33/62* (2013.01); *H01L 27/156* (2013.01)

(58) Field of Classification Search  
CPC .... H01L 27/15–27/156; H01L 27/32–27/3297  
USPC ...................................................... 257/88, 89  
See application file for complete search history.

(56) References Cited

U.S. PATENT DOCUMENTS

| 2001/0043046 A1* | 11/2001 | Fukunaga ...................... 315/160 |
| 2008/0024056 A1 | 1/2008 | Sung et al. |
| 2009/0231823 A1 | 9/2009 | Kunimatsu et al. |
| 2010/0149775 A1 | 6/2010 | Park et al. |

FOREIGN PATENT DOCUMENTS

| JP | 2009-224478 A | 10/2009 |
| KR | 10-2008-0047839 A | 5/2008 |
| KR | 10-2012-0002708 A | 1/2012 |

* cited by examiner

*Primary Examiner* — Daniel Shook  
(74) *Attorney, Agent, or Firm* — Birch, Stewart, Kolasch & Birch, LLP

(57) ABSTRACT

Discussed is a display device including a wiring substrate having a first substrate layer and a second substrate layer, a conductive adhesive layer configured to cover the wiring substrate, and a plurality of semiconductor light emitting devices coupled to the conductive adhesive layer, and electrically connected to a first electrode and a second electrode, wherein the first electrode is disposed at the first substrate layer, and the second substrate layer includes one surface facing the conductive adhesive layer and the other surface covering the first electrode, and an auxiliary electrode electrically connected to the first electrode and the second electrode are disposed on one surface of the second substrate layer.

23 Claims, 24 Drawing Sheets

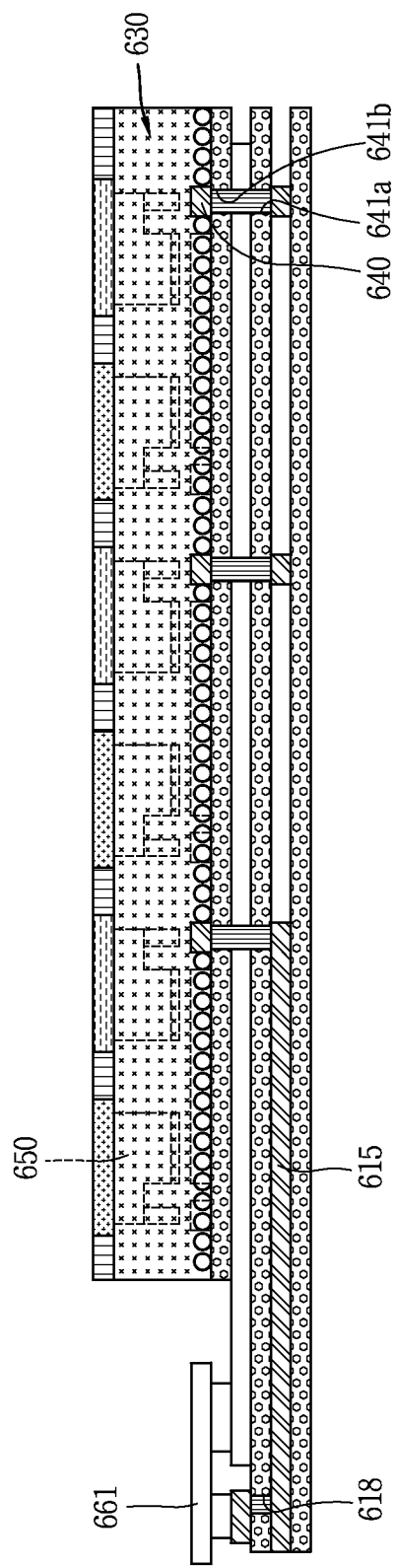

DISPLAY DEVICE USING SEMICONDUCTOR LIGHT EMITTING DEVICE

CROSS-REFERENCE TO RELATED APPLICATIONS

This application claims the benefit of priority to Korean Patent Application No. 10-2013-0127354, filed on Oct. 24, 2013, the contents of which is herein expressly incorporated by reference in its entirety.

BACKGROUND OF THE INVENTION

1. Field of the Invention

The embodiments of the invention relate to a display device, and more particularly, to a display device using a semiconductor light emitting device.

2. Description of the Related Art

In recent years, display devices having excellent characteristics such as low profile, flexibility and the like have been developed in the display technical field. On the contrary, currently commercialized main displays are represented by liquid crystal displays (LCDs) and active matrix organic light emitting diodes (AMOLEDs).

However, there exist problems such as mediocre response time, difficult implementation of flexibility in the instance of LCDs, and there exist drawbacks such as short life span, mediocre yield as well as low flexibility in the instance of AMOLEDs.

On the other hand, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting devices may be used to implement a flexible display, thereby presenting a scheme for solving the problems.

Furthermore, in addition, it may be possible to conceive the structure of connecting lines suitable for a flexible display using semiconductor light emitting devices.

SUMMARY OF THE INVENTION

An aspect of the embodiment of the invention is to provide a new type of display device with flexibility, which is different from the related art.

Another aspect of the embodiment of the invention is to provide a display device in which a semiconductor light emitting device is implemented as a sub-pixel.

In order to accomplish the foregoing tasks, a display device according to an embodiment of the invention may include a wiring substrate having a first substrate layer and a second substrate layer, a conductive adhesive layer configured to cover the wiring substrate, and a plurality of semiconductor light emitting devices coupled to the conductive adhesive layer, and electrically connected to a first electrode and a second electrode. The first electrode may be disposed at the first substrate layer, and the second substrate layer may include one surface facing the conductive adhesive layer and the other surface covering the first electrode, and an auxiliary electrode electrically connected to the first electrode and the second electrode may be disposed on one surface of the second substrate layer.

According to an example associated with the embodiment of the invention, a connecting line portion for connecting the first and the second electrode to a drive unit of the plurality of semiconductor light emitting devices may be formed on one surface of the first substrate layer facing the other surface of the second substrate layer.

The connecting line portion may include a first connecting line extended along the length direction of the first electrode from the first electrode, and a second connecting line electrically connected to the second electrode via a through hole on the first substrate layer, and extended in a direction crossed with the length direction of the second electrode.

The second connecting line may include a left line and a right line disposed at both sides, respectively, around the first connecting line.

According to another example associated with the embodiment of the invention, a connecting line portion for connecting the first and the second electrode to a drive unit of the plurality of semiconductor light emitting devices may be formed on both surfaces of the first substrate layer.

The connecting line portion may include a first connecting line disposed on one surface of the first substrate layer facing the other surface of the second substrate layer, and a second connecting line formed on the other surface of the first substrate layer to be electrically connected to the second electrode.

At least part of the first and the second connecting line may be disposed to be overlapped with each other in the thickness direction of the wiring substrate.

Through holes corresponding to each other may be formed on the first and the second substrate layer to electrically connect the second electrode to at least part of the second connecting line overlapped with the first connecting line. A connecting through hole for extending the second connecting line to one surface of the first substrate layer may be formed on the first substrate layer, and the second connecting line may be connected to the drive unit on the same plane as that of the first connecting line via the connecting through hole.

A connection member for connecting the drive unit to the first and the second connecting line may be formed to cover both surfaces of the first substrate layer so as to connect the second connecting line to the drive unit on a different plane from that of the first connecting line. Any one part of the second connecting line may be extended in one direction, and another part thereof may be extended in the direction opposite to the one direction. The wiring substrate may further include a base substrate covering the other surface of the first substrate layer.

According to still another example associated with the embodiment of the invention, a connecting hole in parallel with the second electrode and crossed with the first electrode may be disposed at the second substrate layer to form a channel for electrically connecting the auxiliary electrode to the first electrode.

The auxiliary electrode may be any one of a plurality of auxiliary electrodes, and the plurality of auxiliary electrodes may be disposed within a single connecting hole. The first electrode may be formed to be disconnected from a plurality of portions, and an additional conductor for plating may be disposed at the plurality of portions.

The conductor may be formed at the plurality of portions by electroless plating. The auxiliary electrode may be formed on one surface of the conductor by electroplating.

Each of the plurality of semiconductor light emitting devices emits light of at least one of red light, green light, blue light and ultraviolet light.

A phosphor layer to convert a predetermined light into at least one of red light, green light and blue light.

Two adjacent semiconductor light emitting devices of the plurality of light emitting devices are electrically connected to the auxiliary electrode.

Furthermore, the embodiment of the invention may include a wiring substrate having a base layer and a substrate layer, a conductive adhesive layer configured to cover the substrate layer, and a plurality of semiconductor light emitting devices coupled to the conductive adhesive layer, and electrically connected to a first electrode and a second electrode. A display device is disclosed in which the first electrode is disposed at the substrate layer, and the second electrode is disposed at the conductive adhesive layer, and a connecting line portion for connecting the first and the second electrode to a drive unit of the plurality of semiconductor light emitting devices are formed at the substrate layer.

The connecting line portion may include a first connecting line disposed on one surface of the substrate layer facing the conductive adhesive layer, and extended from the first electrode, and a second connecting line formed on the other surface of the substrate layer and electrically connected to the second electrode. A through hole for electrically connecting the second electrode to the second connecting line may be formed on the conductive adhesive layer.

According to the embodiment of the invention having the foregoing configuration, a distance of the semiconductor light emitting device may be sufficiently large, and the conductive adhesive layer has softness, thereby implementing a rollable display device.

Furthermore, according to the embodiment of the invention, connecting lines may be overlapped with each other on different planes, thereby further reducing the area of the display device.

BRIEF DESCRIPTION OF THE DRAWINGS

FIGS. 16B and 16C are cross-sectional views taken along lines A-A and B-B, respectively, in FIG. 16A;

DETAILED DESCRIPTION OF THE EMBODIMENTS

Figure 1:
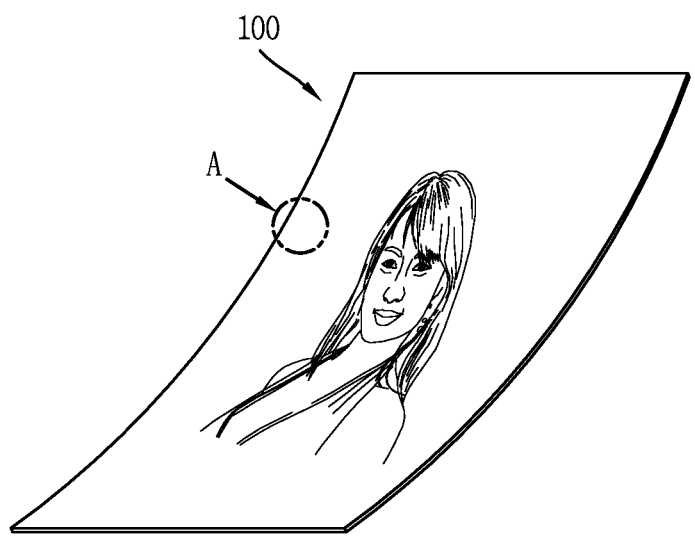
FIG. 1 is a conceptual view illustrating a display device using a semiconductor light emitting device according to an embodiment of the invention.

Hereinafter, the embodiments of the invention disclosed herein will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function. In describing the embodiments of the invention disclosed herein, moreover, the detailed description will be omitted when a specific description for publicly known technologies to which the invention pertains is judged to obscure the gist of the invention. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light emitting device according to an embodiment of the invention.

According to the drawing, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display may be implemented by a semiconductor light emitting device. According to the embodiment of the invention, a light emitting diode (LED) is illustrated as a type of semiconductor light emitting device. The light emitting diode may be formed with a small size to perform the role of a sub-pixel even in the second configuration through this.

Hereinafter, a flexible display implemented using the light emitting diode will be described in more detail with reference to the accompanying drawings.

Figure 2:
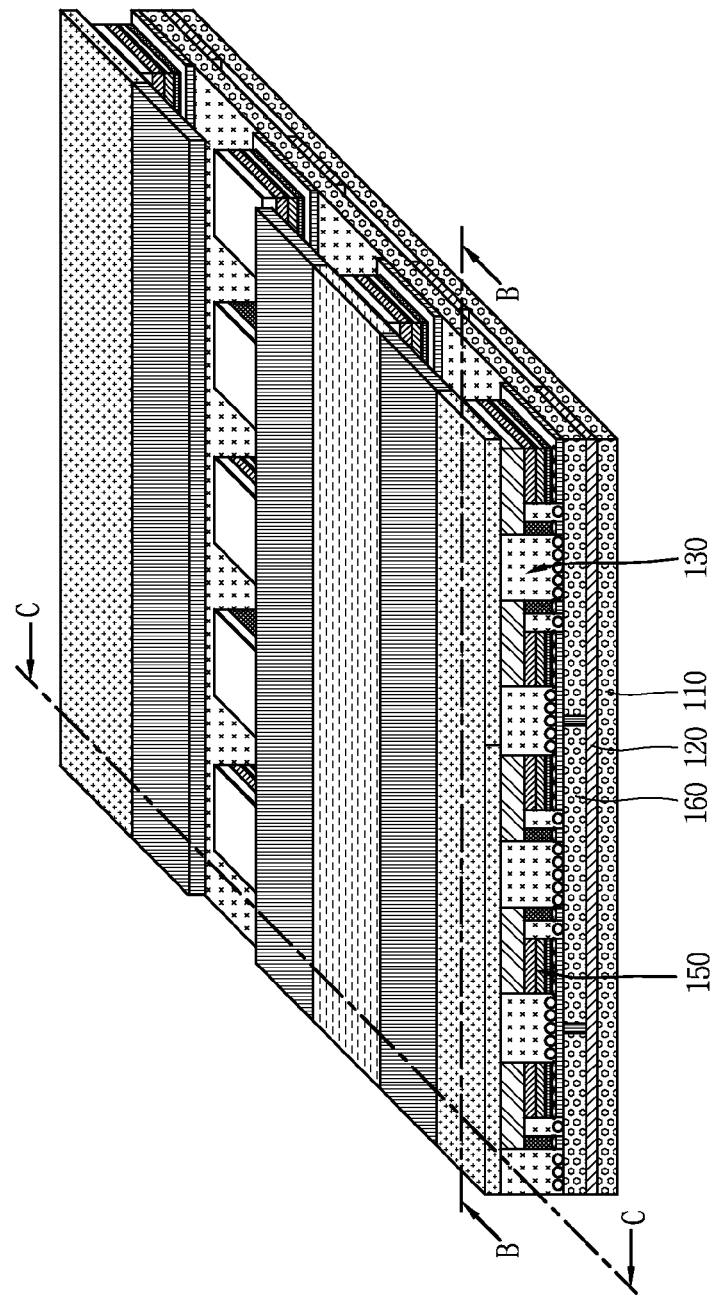
FIG. 2 is a partial enlarged view of portion "A" in FIG. 1, and FIGS. 3A and 3B are cross-sectional views taken along lines B-B and C-C in FIG. 2.
Figure 3A:
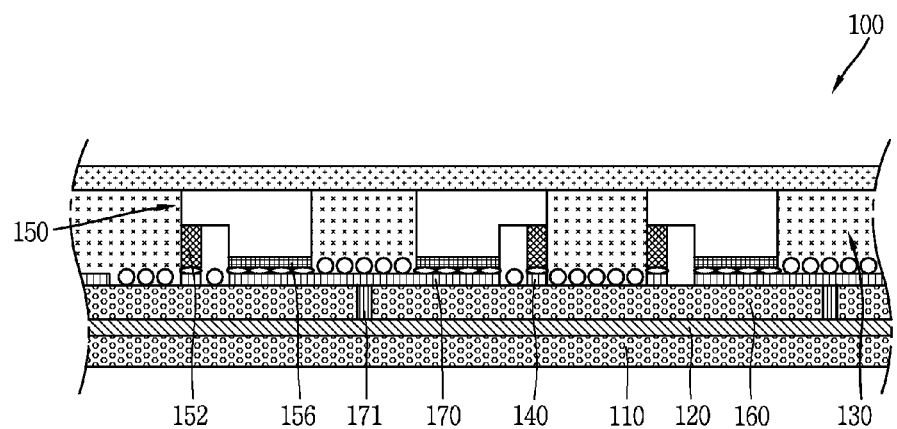
Figure 3B:
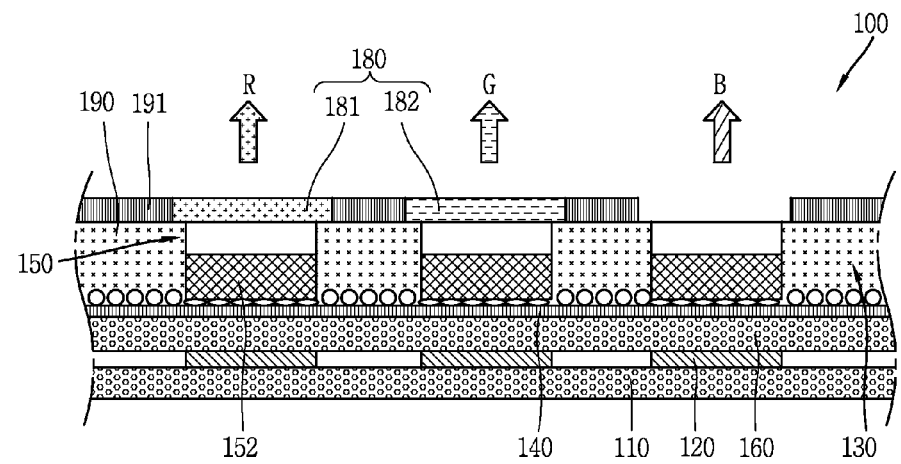
Figure 4:
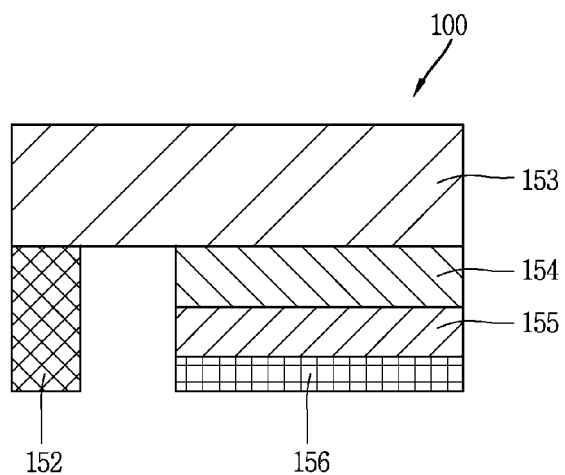
FIG. 4 is a conceptual view illustrating a flip-chip type semiconductor light emitting device in FIG. 3A.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

According to the drawings in FIGS. 2, 3A and 3B, there is illustrated a display device 100 using a passive matrix (PM) type semiconductor light emitting device as a display device 100 using a semiconductor light emitting device. However, the following illustration may be also applicable to an active matrix (AM) type semiconductor light emitting device.

The display device 100 may include a substrate 110, a first electrode 120, a conductive adhesive layer 130, a second electrode 140, and a plurality of semiconductor light emitting devices 150.

The substrate 110 may be a flexible substrate. The substrate 110 may contain glass or polyimide (PI) to implement the flexible display device. In addition, if it is a flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this instance, a configuration in which the insulating layer 160 is deposited on the substrate 110 may be single wiring substrate. More specifically, the insulating layer 160 may be incorporated into the substrate 110 with an insulating and flexible material such as polyimide (PI), PET, PEN or the like to form single wiring substrate.

The auxiliary electrode 170 as an electrode for electrically connecting the first electrode 120 to the semiconductor light emitting device 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the embodiment of the invention may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the embodiment of the invention, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this instance, it may have conductivity by means of the core while breaking an insulating layer on a portion to which heat and pressure are applied. Here, a core may be transformed to implement a layer having both surfaces to which objects contact in the thickness direction of the film.

For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this instance, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this instance, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the embodiment of the invention may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring to the drawing again, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light emitting device 150 is connected thereto in a flip chip form with the application of heat and pressure, the semiconductor light emitting device 150 is electrically connected to the first electrode 120 and second electrode 140.

Referring to FIG. 4, the semiconductor light emitting device may be a flip chip type semiconductor light emitting device.

For example, the semiconductor light emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this instance, the p-type electrode 156 may be electrically connected to a welding portion by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light emitting devices 150. For example, the left and right p-type electrodes of the semiconductor light emitting devices around the auxiliary electrode may be electrically connected to one auxiliary electrode.

More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no push-down of the semiconductor light emitting device.

Furthermore, a plurality of semiconductor light emitting devices 150 constitute a light-emitting array, and a phosphor layer 180 is formed on the light-emitting array.

The light emitting device may include a plurality of semiconductor light emitting devices with different self luminance values. Each of the semiconductor light emitting devices 150 constitutes a sub-pixel, and is electrically connected to the first electrode 120. For example, there may exist a plurality of first electrodes 120, and the semiconductor light emitting devices are arranged in several rows, for instance, and each row of the semiconductor light emitting devices may be electrically connected to any one of the plurality of first electrodes.

Furthermore, the semiconductor light emitting devices may be connected in a flip chip form, and thus semiconductor light emitting devices are grown on a transparent dielectric substrate. Furthermore, the semiconductor light emitting devices may be nitride semiconductor light emitting devices, for instance. The semiconductor light emitting device 150 has an excellent luminance characteristic, and thus it may be possible to configure individual sub-pixels even with a small size thereof.

According to the drawing, a partition wall 190 may be formed between the semiconductor light emitting devices 150. In this instance, the partition wall 190 may perform the role of dividing individual sub-pixels from one another, and be formed as an integral body with the conductive adhesive layer 130. For example, a base member of the anisotropic conductive film may form the partition wall when the semiconductor light emitting device 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this instance, the partition wall 190 may include a black or white insulator according to the purpose of the display device. It may have an effect of enhancing reflectivity when the partition wall of the while insulator is used, and increase contrast while at the same time having reflective characteristics.

The phosphor layer 180 may be located at an outer surface of the semiconductor light emitting device 150. For example, the semiconductor light emitting device 150 is a blue semiconductor light emitting device that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light emitting device 151 at a location implementing a red sub-pixel, and a green phosphor 182 capable of converting blue light into green (G) light may be deposited on the blue semiconductor light emitting device 151 at a location implementing a green sub-pixel. Furthermore, only the blue semiconductor light emitting device 151 may be solely used at a location implementing a blue sub-pixel. In this instance, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed, thereby implementing sub-pixels.

However, the embodiment of the invention may not be necessarily limited to this, and the semiconductor light emitting device 150 may be combined with a quantum dot (QD) instead of a phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the embodiment of the invention may not be necessarily limited to this, and another structure for implementing blue, red and green may be also applicable thereto.

Figure 5A:
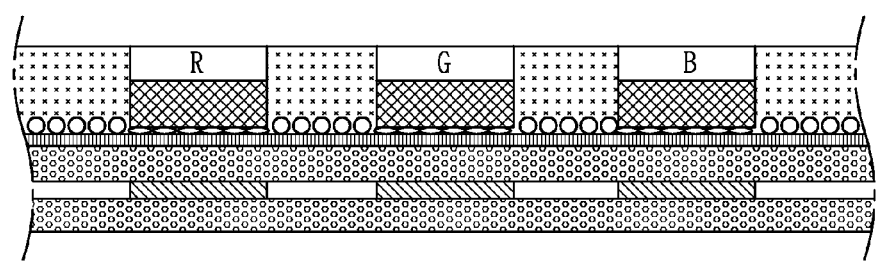
FIGS. 5A through 5C are conceptual views illustrating various forms for implementing colors in connection with a flip-chip type semiconductor light emitting device.

Referring to FIG. 5A, each of the semiconductor light emitting devices 150 may be implemented with a high-power light emitting device that emits various lights including blue in which gallium nitride (GaN) is mostly used, and indium (In) and or aluminum (Al) are added thereto.

In this instance, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by means of the red, green and blue semiconductor light emitting devices, thereby implementing a full color display.

Figure 5B:
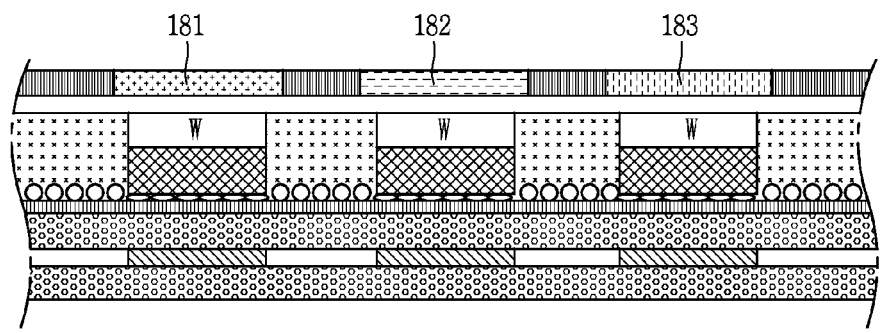

Referring to FIG. 5B, the semiconductor light emitting device may have a white light emitting device (W) provided with a yellow phosphor layer for each element. In this instance, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
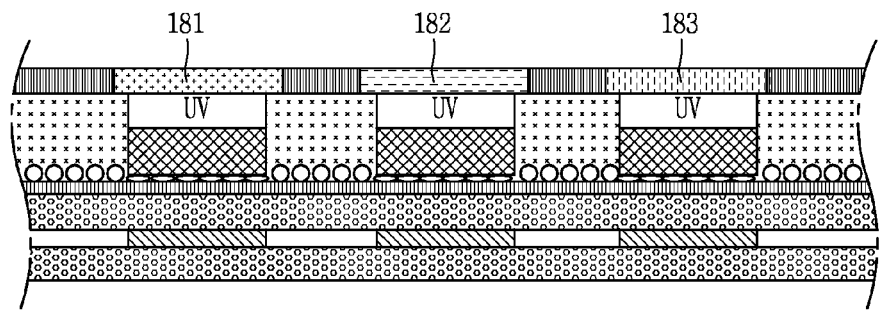

Referring to FIG. 5C, it may be possible to also have a structure in which a red phosphor layer 181, a green phosphor layer 182 and blue phosphor layer 183 may be provided on a ultra violet light emitting device (UV). In this manner, the semiconductor light emitting device can be used over the entire region up to ultra violet (UV) as well as visible light, and may be extended to a form of semiconductor light emitting device in which ultra violet (UV) can be used as an excitation source.

Taking the example into consideration again, the semiconductor light emitting device 150 is placed on the conductive adhesive layer 130 to configure a sub-pixel in the display device. The semiconductor light emitting device 150 may have excellent luminance characteristics, and thus it may be possible to configure individual sub-pixels even with a small size thereof. The size of the individual semiconductor light emitting device 150 may be less than 80 μm in the length of one side thereof, and formed with a rectangular or square shaped element. In the instance of a rectangular shaped element, the size thereof may be less than 20×80 μm.

Furthermore, even when a square shaped semiconductor light emitting device 150 with a length of side of 10 μm is used for a sub-pixel, it will exhibit a sufficient brightness for implementing a display device. Accordingly, for example, in the instance of a rectangular pixel in which one side of a sub-pixel is 600 μm in size, and the remaining one side thereof is 300 μm, a relative distance between the semiconductor light emitting devices becomes sufficiently large. Accordingly, in this instance, it may be possible to implement a flexible display device having a HD image quality.

A display device using the foregoing semiconductor light emitting device will be fabricated by a new type of fabrication method. Hereinafter, the fabrication method will be described with reference to FIG. 6.

Figure 6:
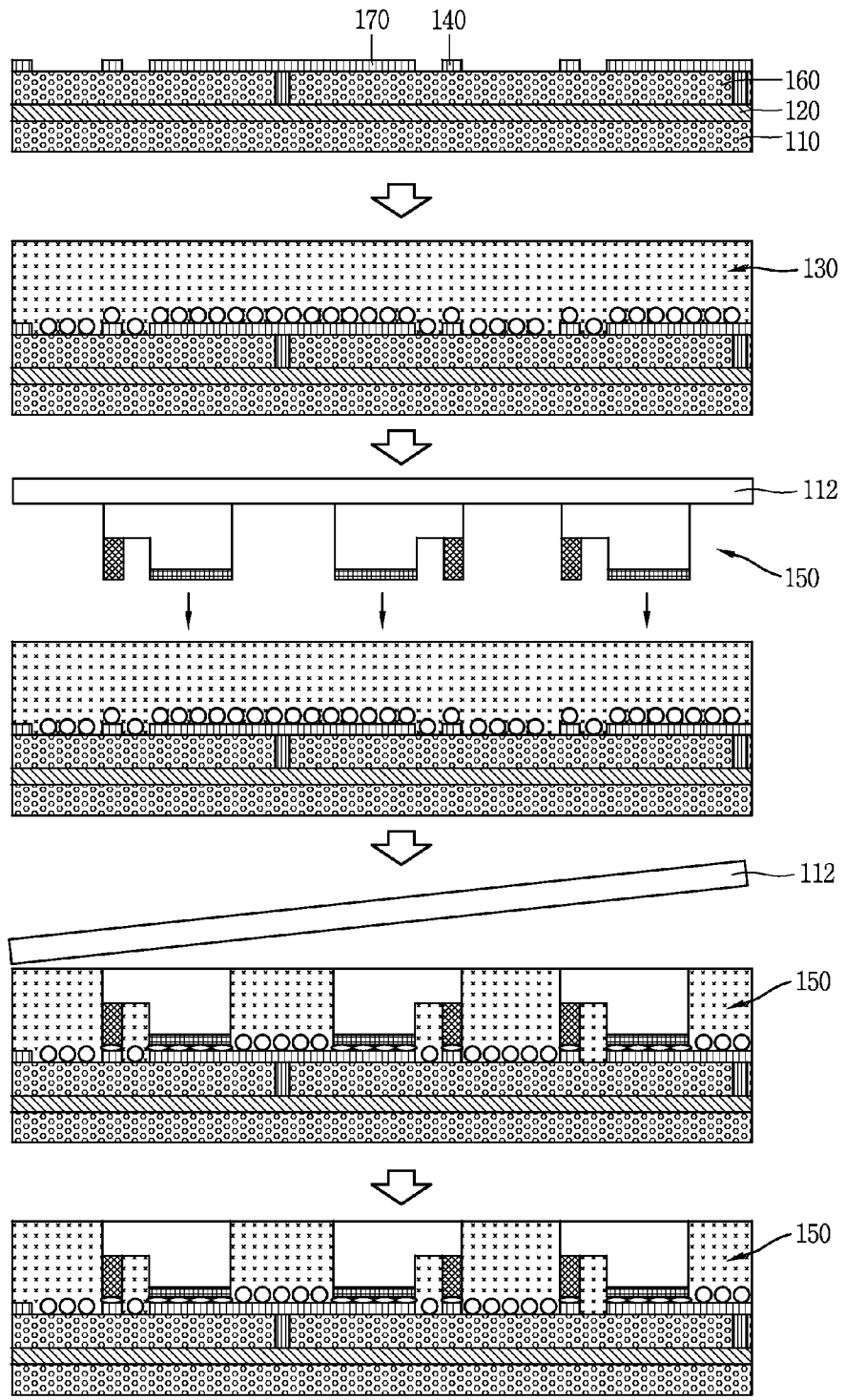
FIG. 6 is cross-sectional views illustrating a method of fabricating a display device using a semiconductor light emitting device according to the embodiment of the invention.

FIG. 6 is cross-sectional views illustrating a method of fabricating a display device using a semiconductor light emitting device according to the embodiment of the invention.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this instance, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light emitting devices 150 corresponding to the location of the auxiliary electrodes 170 and second electrodes 140 and constituting individual pixels is disposed such that the semiconductor light emitting device 150 faces the auxiliary electrode 170 and second electrode 140.

In this instance, the second substrate 112 as a growth substrate for growing the semiconductor light emitting device 150 may be a sapphire substrate or silicon substrate.

The semiconductor light emitting device may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light emitting device 150 and the auxiliary electrode 170 and second electrode 140 may have conductivity due to the characteristics of an anisotropic conductive film having conductivity by thermal compression, thereby allowing the electrodes and semiconductor light emitting device 150 to be electrically connected to each other. At this time, the semiconductor light emitting device 150 may be inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method.

Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer.

Furthermore, it may further include the process of forming a phosphor layer on one surface of the semiconductor light emitting device 150. For example, the semiconductor light emitting device 150 may be a blue semiconductor light emitting device for emitting blue (B) light, and red or green phosphor for converting the blue (B) light into the color of the sub-pixel may form a layer on one surface of the blue semiconductor light emitting device.

The fabrication method or structure of a display device using the foregoing semiconductor light emitting device may be modified in various forms. For such an example, the foregoing display device may be applicable to a vertical semiconductor light emitting device. Hereinafter, the vertical structure will be described with reference to FIGS. 5 and 6.

Furthermore, according to the following modified example or embodiment of the invention, the same or similar reference numerals are designated to the same or similar configurations to the foregoing example, and the description thereof will be substituted by the earlier description.

Figure 7:
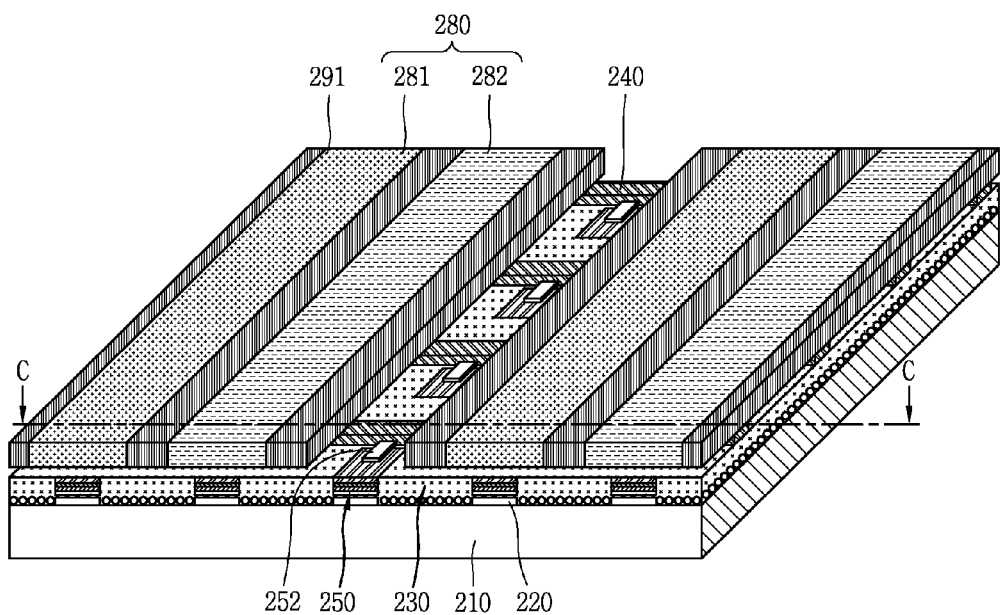
FIG. 7 is a perspective view illustrating a display device using a semiconductor light emitting device according to another embodiment of the invention.
Figure 8:
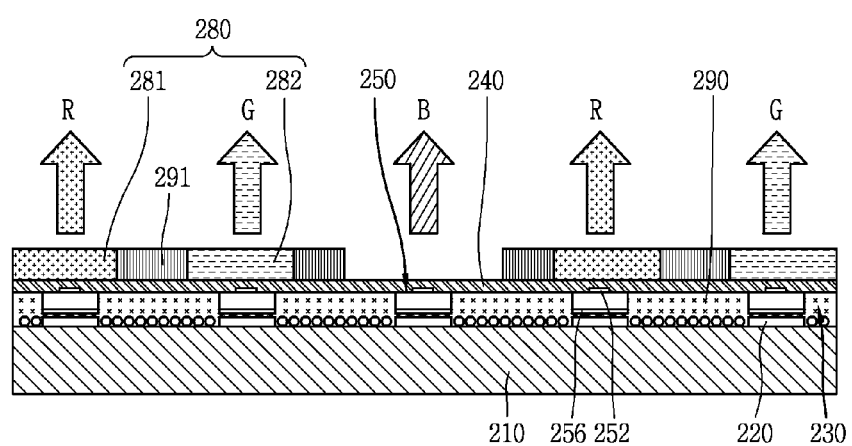
FIG. 8 is a cross-sectional view taken along line C-C in FIG. 7.
Figure 9:
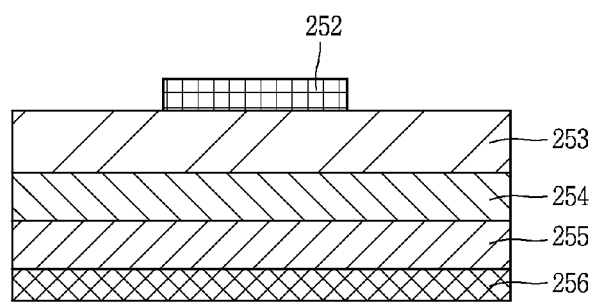
FIG. 9 is a conceptual view illustrating a vertical type semiconductor light emitting device in FIG. 8.

FIG. 7 is a perspective view illustrating a display device using a semiconductor light emitting device according to another embodiment of the invention. FIG. 8 is a cross-sectional view taken along line C-C in FIG. 7, and FIG. 9 is a conceptual view illustrating a vertical type semiconductor light emitting device in FIG. 8.

According to the drawings, the display device may be display device using a passive matrix (PM) type of vertical semiconductor light emitting device.

The display device may include a substrate 210, a first electrode 220, a conductive adhesive layer 230, a second electrode 240 and a plurality of semiconductor light emitting devices 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with an electrode having a bar elongated in one direction. The first electrode 220 may be formed to perform the role of a data electrode.

The conductive adhesive layer 230 is formed on the substrate 210 located with the first electrode 220. Similarly to a display device to which a flip chip type light emitting device is applied, the conductive adhesive layer 230 may be an anisotropic conductive film (ACF), an anisotropic conductive paste, a solution containing conductive particles, and the like. However, the embodiment of the invention illustrates an instance where the conductive adhesive layer 230 is implemented by an anisotropic conductive film.

When an anisotropic conductive film is located in a state that the first electrode 220 is located on the substrate 210, and then heat and pressure are applied to connect the semiconductor light emitting device 250 thereto, the semiconductor light emitting device 250 is electrically connected to the first electrode 220. At this time, the semiconductor light emitting device 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light emitting device 250 and the first electrode 220.

In this manner, the semiconductor light emitting device 250 is placed on the conductive adhesive layer 230, thereby configuring a separate sub-pixel in the display device. The semiconductor light emitting device 250 may have excellent luminance characteristics, and thus it may be possible to configure individual sub-pixels even with a small size thereof.

The size of the individual semiconductor light emitting device 250 may be less than 80 µm in the length of one side thereof, and formed with a rectangular or square shaped element. In an instance of a rectangular shaped element, the size thereof may be less than 20×80 µm.

The semiconductor light emitting device 250 may be a vertical structure.

A plurality of second electrodes 240 disposed in a direction crossed with the length direction of the first electrode 220, and electrically connected to the vertical semiconductor light emitting device 250 may be located between vertical semiconductor light emitting devices.

Referring to FIG. 9, the vertical semiconductor light emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this instance, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light emitting device 250, thereby providing a great advantage capable of reducing the chip size.

Referring to FIG. 8 again, a phosphor layer 280 may be formed on one surface of the semiconductor light emitting device 250. For example, the semiconductor light emitting device 250 is a blue semiconductor light emitting device 251 that emits blue (B) light, and the phosphor layer 280 for converting the blue (B) light into the color of the sub-pixel may be provided thereon. In this instance, the phosphor layer 280 may be a red phosphor 281 and a green phosphor 282 constituting individual pixels.

In other words, a red phosphor 281 capable of converting blue light into red (R) light may be deposited on the blue semiconductor light emitting device 251 at a location implementing a red sub-pixel, and a green phosphor 282 capable of converting blue light into green (G) light may be deposited on the blue semiconductor light emitting device 251 at a location implementing a green sub-pixel. Furthermore, only the blue semiconductor light emitting device 251 may be solely used at a location implementing a blue sub-pixel. In this instance, the red (R), green (G) and blue (B) sub-pixels may implement one pixel.

However, the embodiment of the invention may not be necessarily limited to this, and another structure for implementing blue, red and green may be also applicable thereto as described above in a display device to which a flip chip type light emitting device is applied.

Taking the embodiment of the invention into consideration again, the second electrode 240 is located between the semiconductor light emitting devices 250, and electrically connected to the semiconductor light emitting devices 250. For example, the semiconductor light emitting devices 250 may be disposed in a plurality of rows, and the second electrode 240 may be located between the rows of the semiconductor light emitting devices 250.

Since a distance between the semiconductor light emitting devices 250 constituting individual pixels is sufficiently large, the second electrode 240 may be located between the semiconductor light emitting devices 250.

The second electrode 240 may be formed with an electrode having a bar elongated in one direction, and disposed in a perpendicular direction to the first electrode.

Furthermore, the second electrode 240 may be electrically connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light emitting device 250.

According to the drawing, the second electrode 240 may be located on the conductive adhesive layer 230. According to circumstances, a transparent insulating layer containing silicon oxide (SiOx) may be formed on the substrate 210 formed with the semiconductor light emitting device 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of bad adhesiveness with an n-type semiconductor. Accordingly, the second electrode 240 may be placed between the semiconductor light emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light emitting devices 250. In other words, the partition wall 290 may be disposed between the vertical semiconductor light emitting devices 250 to isolate the semiconductor light emitting device 250 constituting individual pixels. In this instance, the partition wall 290 may perform the role of dividing individual sub-pixels from one another, and be formed as an integral body with the conductive adhesive layer 230. For example, a base member of the anisotropic conductive film may form the partition wall when the semiconductor light emitting device 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. In this instance, the partition wall 290 may include a black or white insulator according to the purpose of the display device.

If the second electrode 240 is precisely located on the conductive adhesive layer 230 between the semiconductor light emitting devices 250, the partition wall 290 may be located between the semiconductor light emitting device 250 and second electrode 240. Accordingly, individual sub-pixels may be configured even with a small size using the semiconductor light emitting device 250, and a distance between the semiconductor light emitting devices 250 may be relatively sufficiently large to place the second electrode 240 between the semiconductor light emitting devices 250, thereby having the effect of implementing a flexible display device having a HD image quality.

Furthermore, according to the drawing, a black matrix 291 may be disposed between each phosphor layer to enhance contrast. In other words, the black matrix 191 can enhance the contrast of luminance.

As described above, the semiconductor light emitting device 250 is located on the conductive adhesive layer 230, thereby constituting individual pixels on the display device. Since the semiconductor light emitting device 250 has excellent luminance characteristics, thereby configuring individual sub-pixels even with a small size thereof. As a result, it may be possible to implement a full color display in which the sub-pixels of red (R), green (G) and blue (B) implement one pixel by means of the semiconductor light emitting device.

An electrode connecting line structure for reducing the size of a bezel may be taken into consideration in a display device using the foregoing semiconductor light emitting device according to the embodiment of the invention. Hereinafter, the connecting line structure will be described.

Figure 10:
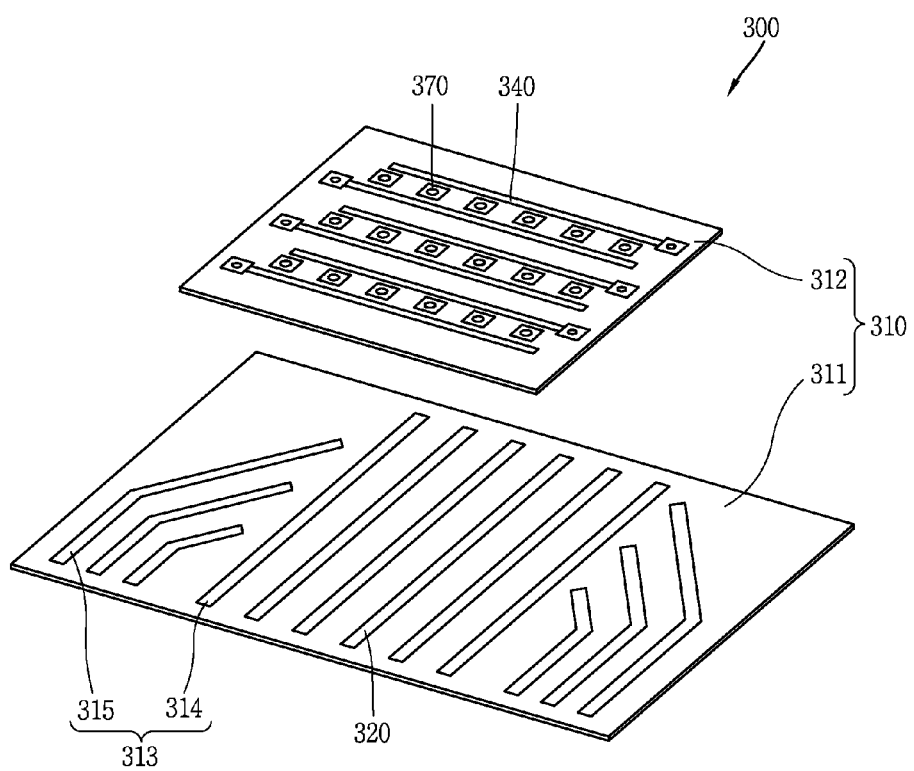
FIG. 10 is an exploded view illustrating the structure of connecting lines in a display device according to the embodiment of the invention.
Figure 11A:
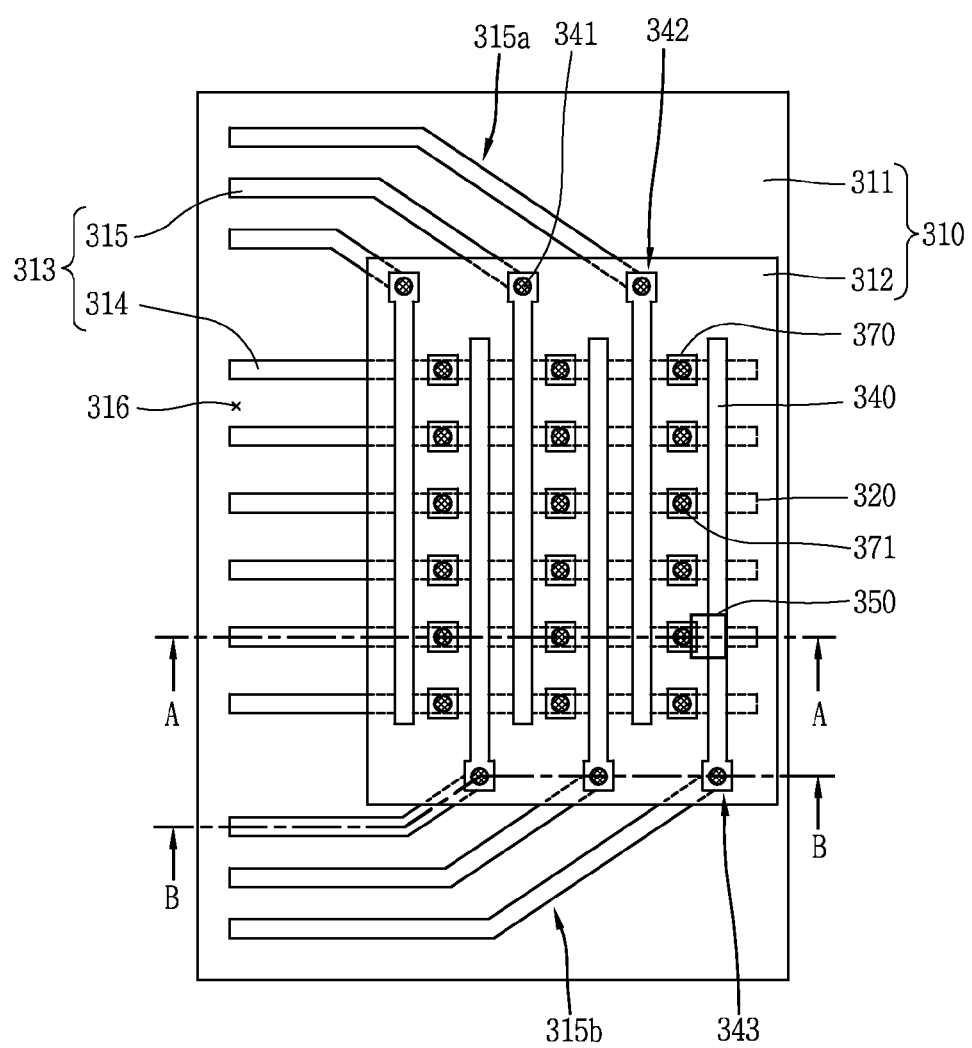
FIG. 11A is a plan view illustrating a display device in FIG. 10.
Figure 11B:
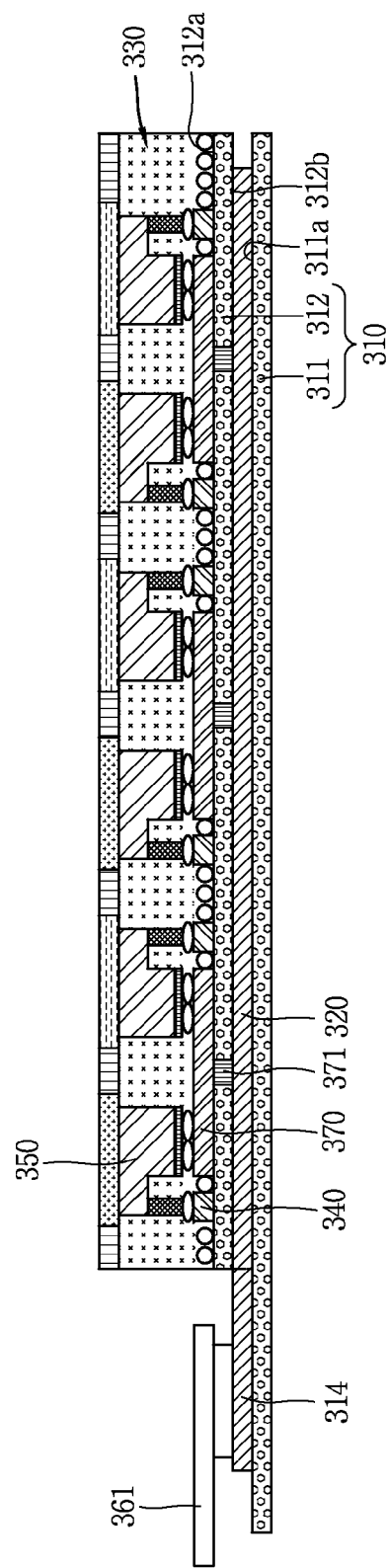
FIGS. 11B and 11C are cross-sectional views taken along lines A-A and B-B, respectively, in FIG. 11A.
Figure 11C:
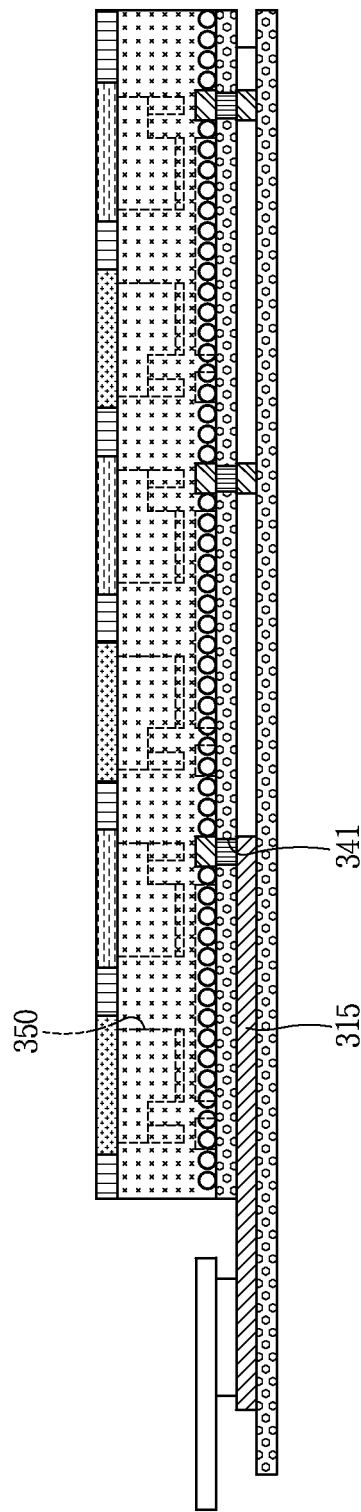

FIG. 10 is an exploded view illustrating the structure of connecting lines in a display device according to the embodiment of the invention, and FIG. 11A is a plan view illustrating a display device in FIG. 10, and FIGS. 11B and 11C are cross-sectional views taken along lines A-A and B-B, respectively, in FIG. 11A.

Referring to the drawings, the display device 300 may include a wiring substrate 310, a conductive adhesive layer 330, and a semiconductor light emitting device 350 (hereinafter, the conductive adhesive layer and semiconductor light emitting device are only illustrated in the cross-sectional view).

A first electrode 320 and a second electrode 340 are disposed at the wiring substrate 310, and may include a plurality of layers. The plurality of layers may include a first substrate layer 311 and a second substrate layer 312, and formed with a structure in which the second substrate layer 312 is deposited on an upper surface of the first substrate layer 311.

According to the drawing, the first substrate layer 311 may perform the role of the substrate 110 (refer to FIG. 3A) in a display device described with reference to FIGS. 3A and 3B, and the second substrate layer 312 may perform the function of an insulating layer 160 (refer to FIG. 3). Accordingly, the first substrate layer 311 and second substrate layer 312, respectively, may be formed of an insulating and flexible material such as polyimide (PI), PET, PEN and the like.

The conductive adhesive layer 330 is formed to cover the wiring substrate 310. More specifically, the conductive adhesive layer 330 is formed on one surface of the second substrate layer 312. As described above, the conductive adhesive layer 330 may be a layer having adhesiveness, conductivity and softness, thereby providing a flexible function to the display device. According to the embodiment of the invention, it is illustrated in which the conductive adhesive layer 330 is formed with an anisotropic conductive film (ACF).

The semiconductor light emitting device 350 may be a flip chip type light emitting device, and a plurality of semiconductor light emitting devices are coupled to the anisotropic conductive film, and electrically connected to the wiring substrate 310 and second electrode 340.

For example, the first electrode 320 and second electrode 340 may be disposed in a direction crossed with each other, and a flip chip type p-type electrode 156 (refer to FIG. 4) may be connected to the first electrode 320 through the auxiliary electrode 370, and an n-type electrode 152 (refer to FIG. 4) may be connected to the second electrode 340. In this instance, the first electrode 320 may be a vertical electrode in which a plurality of electrode lines are disposed in the vertical direction in the aspect of structure, and may be a data electrode in the aspect of function. Furthermore, the second electrode 340 may be a horizontal electrode in which a plurality of electrode lines are disposed in the horizontal direction (direction perpendicular to the first electrode) in the aspect of structure, and may be a data electrode in the aspect of function, and may be a gate electrode in the aspect of function.

Referring to the structure of the wiring substrate 310 again, the first electrode 320 is disposed at the first substrate layer 311. More specifically, the first electrode 320 is formed on one surface 311a of the first substrate layer 311, and covered by the second substrate layer 312. The second substrate layer 312 may include one surface 312a facing the conductive adhesive layer and the other surface 312b covering the first electrode 320, and the auxiliary electrode 370 and the second electrode 340 are disposed on the one surface 312a of the second substrate layer 312.

The auxiliary electrode 370 has a dot shape, and may be electrically connected to the first electrode 220 by means of an electrode hole 371 passing through the second substrate layer 312. The electrode hole 371 may be formed by filling a conductive material in a via hole.

According to the drawings, a connecting line portion 313 (or a connecting line) for connecting the first electrode 320 and second electrode 340 to a drive unit of the plurality of semiconductor light emitting devices 350 is formed on one surface 311a of the first substrate layer 311 facing the other surface 312b of the second substrate layer 312. The drive unit may be a driving semiconductor chip, and mounted on a connection member 361 in the form of a chip-on film (COF), and the connecting line portion 313 is connected to the connection member 361.

More specifically, the connecting line portion 313 may include a first connecting line 314 and a second connecting line 315.

The first connecting line 314 is extended from the first electrode 320 along the length direction of the first electrode 320. Accordingly, the first connecting line 314 may be arranged in the vertical direction. The first connecting line 314 is extended to the connection region 316 of the first substrate layer 311, and connected to the connection member 361 in the connection region 316. The connection region 316 may be formed at one end portion of the first substrate layer 311.

According to the embodiment of the invention, it is illustrated that the first connecting line 314 is extended in one direction from the first electrode 320, but the embodiment of the invention may not be necessarily limited to this. For example, the first connecting line 314 may be formed in both directions from the first electrode 320. For such an example, any one part of the first connecting line 314 may be extended from a plurality of electrode lines to one end portion of the first substrate layer 311, and another part thereof may be extended to the other end portion of the first substrate layer 311, which is an opposite direction thereof. Furthermore, the connecting line portion 313 extended in a direction opposite to each other may be sequentially disposed thereon.

The second connecting line 315 is electrically connected to the second electrode 340 via the through hole 341 of the second substrate layer 312, and extended in a direction crossed with the length direction of the second electrode 340 from the second electrode 340.

There are provided a plurality of through holes 341, and may be formed by filling a conductive material in via holes. According to the drawing, the plurality of through holes may include a first and a second group (342, 343) disposed adjacent to both sides of the second substrate layer 312.

Furthermore, the second connecting line 315 may include a left line 315a and a right line 315b disposed at both sides, respectively, around the first connecting line 314. The left line 315a and right line 315b are extended to the connection region 316 of the first substrate layer 311 from the first and the second group 342, 343.

According to the foregoing structure, the drive unit may pass through the connection region 316, the connecting line portion 313 and electrodes to drive a semiconductor light emitting device, thereby implement a flexible display in which red, green and blue sub-pixels forms one pixel.

Furthermore, according to the embodiment of the invention, there is presented a mechanism capable of further reducing the size of a bezel in the display device. Hereinafter, the mechanism will be described in more detail with reference to the accompanying drawings.

Figure 12:
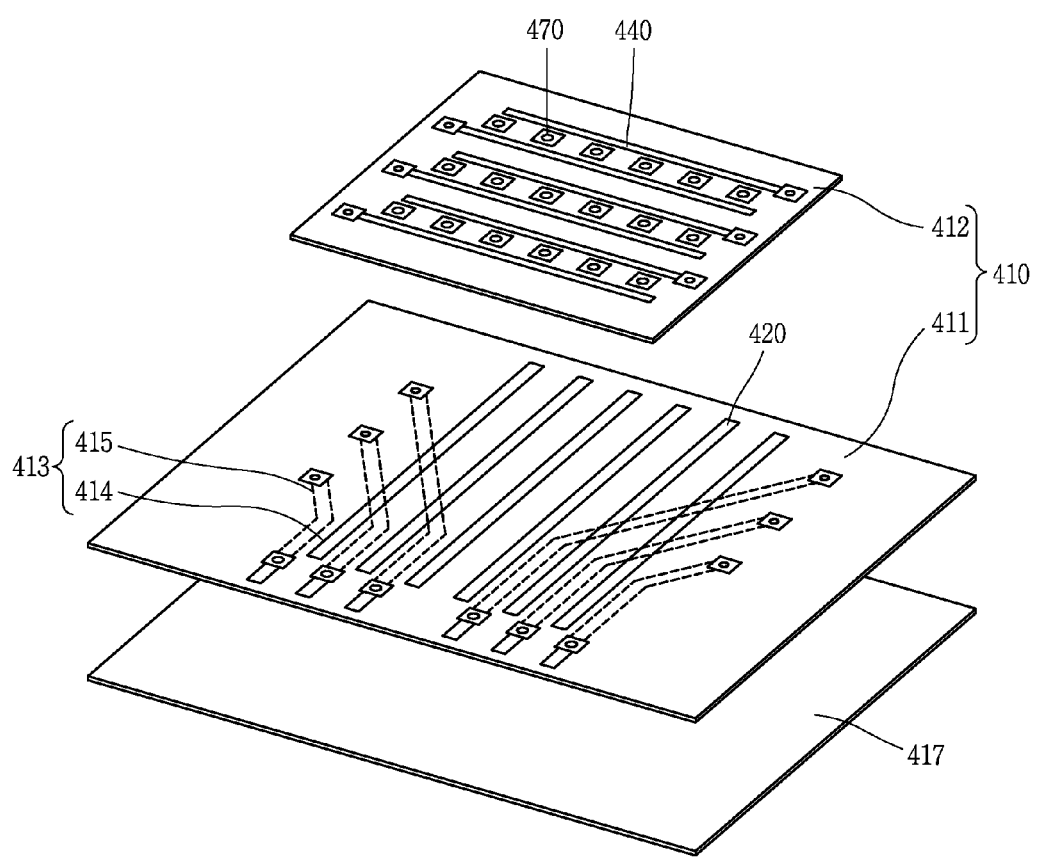
FIG. 12 is an exploded view illustrating the structure of connecting lines in a display device according to still another embodiment to the invention.
Figure 13A:
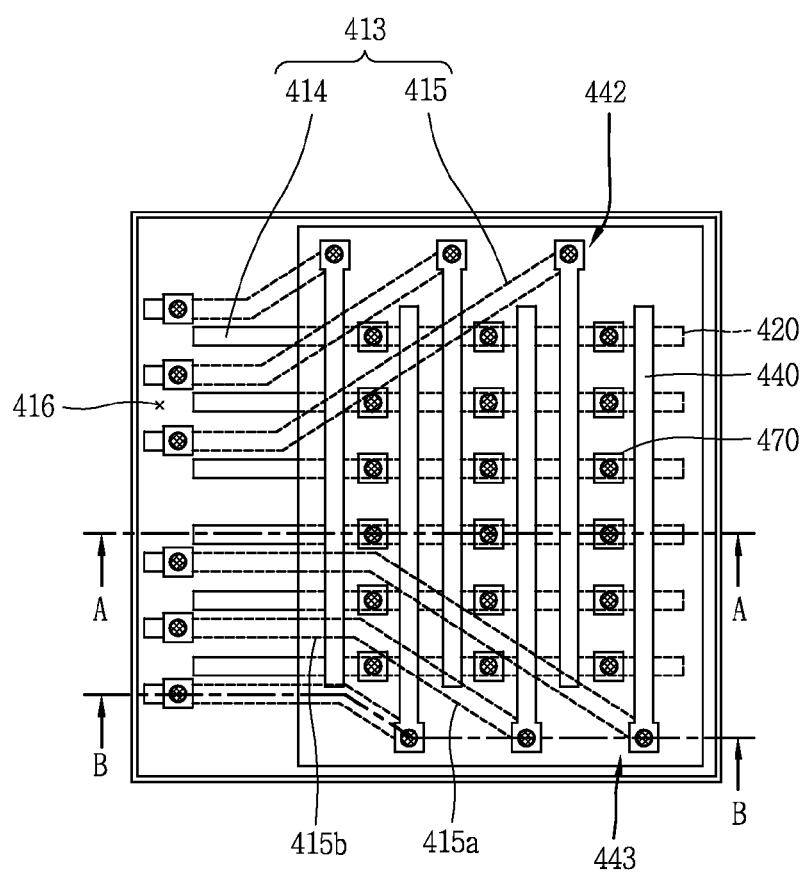
FIG. 13A is a plan view illustrating a display device in FIG. 12.
Figure 13B:
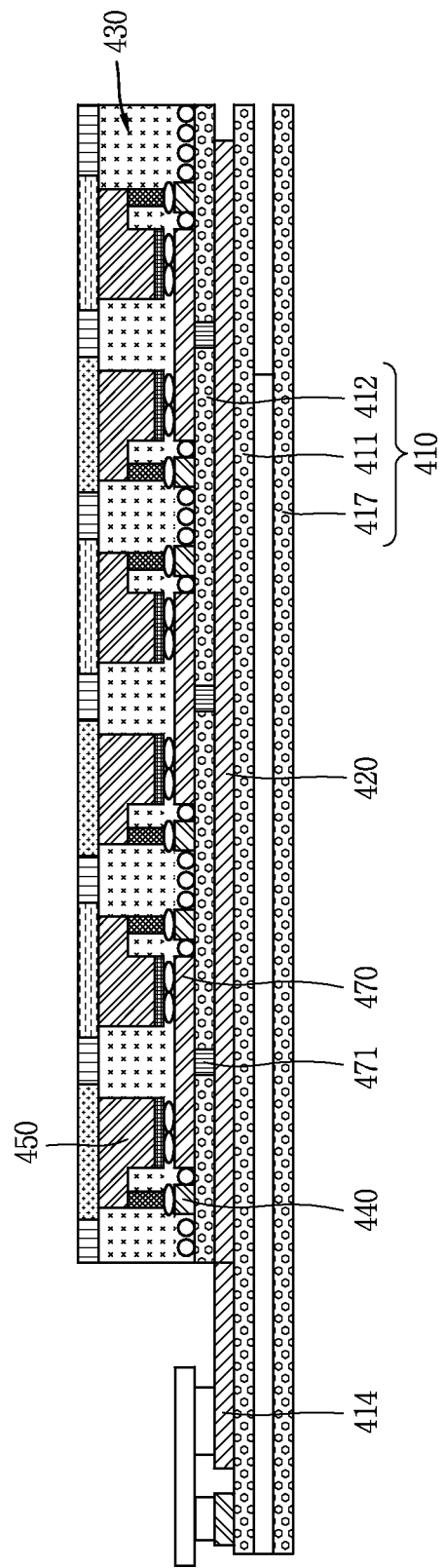
FIGS. 13B and 13C are cross-sectional views taken along lines A-A and B-B, respectively, in FIG. 13A.
Figure 13C:
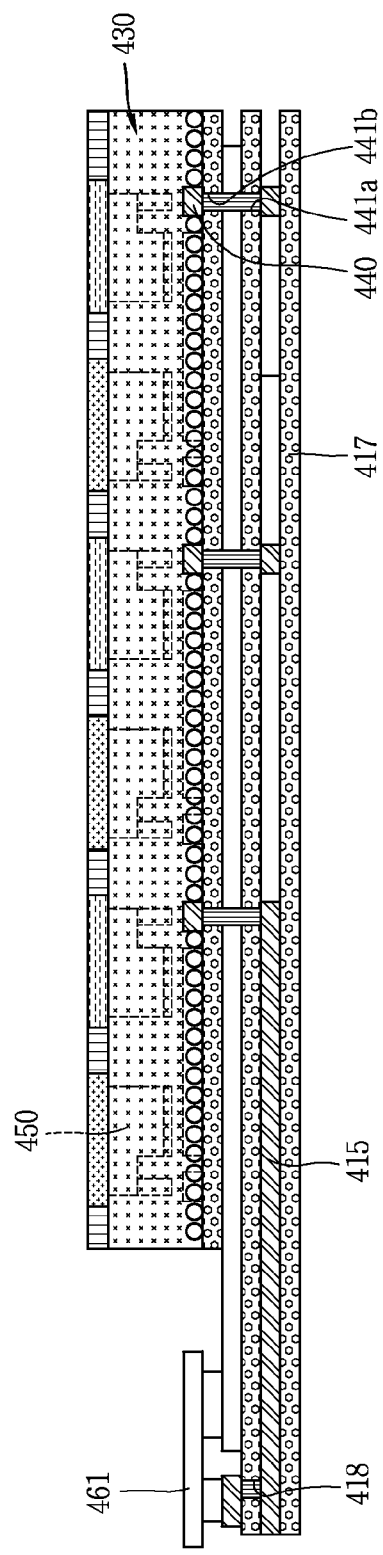

FIG. 12 is an exploded view illustrating the structure of connecting lines in a display device according to still another embodiment to the invention, and FIG. 13A is a plan view illustrating a display device in FIG. 12, and FIGS. 13B and 13C are cross-sectional views taken along lines A-A and B-B, respectively, in FIG. 13A.

A wiring substrate 410 may include a first substrate layer 411, a second substrate layer 412 and a base substrate 417. Accordingly, the wiring substrate 410 may be formed with a 3-layer structure, and as an example, the second substrate layer 412 is deposited on one surface of the first substrate layer 411, and the base substrate 417 is formed to cover the other surface of the first substrate layer 411.

For example, the first electrode 420 and second electrode 440 may be disposed in a direction crossed with each other, and a flip chip type p-type electrode 156 (refer to FIG. 4) may be connected to the first electrode 420 through the electrode hole 471 and auxiliary electrode 470, and an n-type electrode 152 (refer to FIG. 4) may be connected to the second electrode 440.

Referring to the drawings, a connecting line portion 413 for connecting the first electrode 420 and second electrode 440 to a drive unit of a plurality of semiconductor light emitting devices is formed on both surfaces of the first substrate layer 411. The first substrate layer 411 may be a polyimide. Subsequently, and according to the embodiment of the invention, a line may be formed on both surfaces around the polyimide substrate, thereby reducing the size of a bezel in the display device.

The connecting line portion 413 may include a first connecting line 414 and a second connecting line 415.

The first connecting line 414 is extended from the first electrode 420 and disposed on one surface 411a of the first substrate layer 411 facing the other surface 412b of the second substrate layer 412. On the contrary, the second connecting line 415 is formed on a plane different from the first connecting line 414. More specifically, the second connecting line 415 may be formed on the other surface of the first substrate layer 411 to be electrically connected to the second electrode 440.

The first connecting line 414 and second connecting line 415 are disposed such that at least part thereof is overlapped with each other in the thickness direction. The first connecting line 414 and second connecting line 415 may be disposed on different planes, thereby allowing the overlapping structure.

For example, the first electrode 420 is a vertical electrode in which a plurality of electrodes are disposed in a vertical direction, and the first connecting line 414 is extended from the vertical electrode along the vertical direction.

According to the drawing, through holes 441*a*, 411*b* corresponding to each other are formed at the first substrate layer 411 and second substrate layer 412 to connect the second electrode 440 to the second connecting line 415 overlapped with the first connecting line 414. The second connecting line 415 is extended toward an inner portion of the wiring substrate 410 located with the first connecting line 414 from the through holes 441*a*, 411*b*.

According to the drawing, the through holes 441*a* of the second substrate layer 412 may include a first and a second group 442, 443 disposed adjacent to both sides of the second substrate layer 412, and the second connecting line 415 is extended toward an inner portion of the wiring substrate 410 while forming a left and right symmetrical shape from the first and the second group 442, 443.

Taking one connecting line into consideration, the second connecting line 415 may include a diagonal portion 415*a* and a vertical portion 415*b*. The diagonal portion 415*a* may be a portion extended toward an inner portion of the wiring substrate 410 from the through hole 441*a*, and the vertical portion 415*b* may be a portion connected to the diagonal portion 415*a*, and extended in the vertical direction similar to that of the extension direction of the vertical electrode.

According to the drawing, the first connecting line 414 and second connecting line 415 are extended to a connection region 416 of the first substrate layer 411, and connected to a connection member 461 in the connection region 416. The connection member 461 may be formed at one end portion of the first substrate layer 411.

However, the embodiment of the invention may not be necessarily limited to the structure, it may be possible to provide an embodiment of the invention in which any one part of the second connecting line 415 is extended to one direction, and another part thereof is extended to the direction opposite to the one direction. In other words, it may be also possible to have a structure in which connection a region is formed at both end portions of the wiring substrate 410, respectively, and part of the second connecting line 415 is extended to one end portion and another part thereof is extended to the other end portion and connected to a plurality of connection members, respectively.

Referring to the drawings again, the base substrate 417 is formed to cover the entire portion of the second connecting line 415 located on the other surface of the first substrate layer. A connecting through hole 418 for extending the second connecting line 415 to one surface of the first substrate layer 411 is formed at the first substrate layer 411, and the second connecting line 415 may be connected to the drive unit on the same plane as that of the first connecting line 414 through the connecting through hole 418. The connecting through hole 418 allows part of the second connecting line 415 disposed on one surface of the first substrate layer 411 to be electrically connected to part of the second connecting line 415 disposed on the other surface thereof by filling a conductive material in a via hole.

Furthermore, part of the second connecting line 415 extended to one surface of the first substrate layer 411 may be located between the first connecting lines 414 along the horizontal direction. For example, part of the second connecting line 415 may be sequentially disposed with the first connecting line 414 along the horizontal direction on one surface of the first substrate layer.

According to the structure, the width of a portion for connecting lines may be reduced, thereby implementing a slim bezel. Furthermore, the display device having the foregoing structure may be modified and carried out in various forms.

Hereinafter, the embodiments of the invention will be described in more detail with reference to the accompanying drawings.

Figure 14:
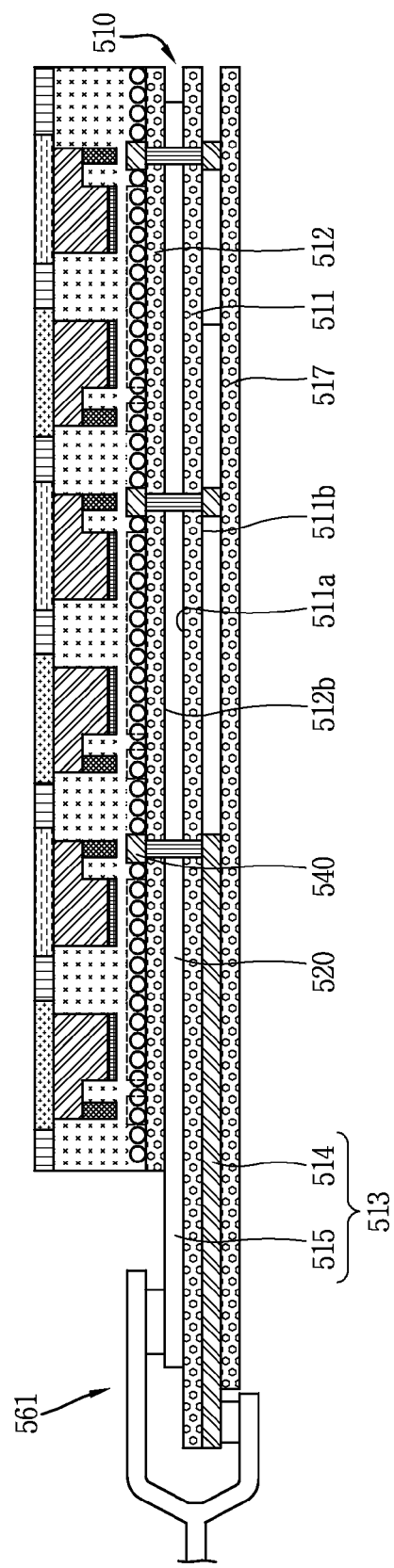
FIG. 14 is a cross-sectional view illustrating the structure of connecting lines in a display device according to yet still another embodiment of the invention.

FIG. 14 is a cross-sectional view illustrating the structure of connecting lines in a display device according to yet still another embodiment of the invention.

According to the example, the wiring substrate 510 may be formed with a 3-layer structure, and as an example, the second substrate layer 512 is deposited on one surface of the first substrate layer 511, and the base substrate 517 is formed to cover the other surface of the first substrate layer 511.

A connecting line portion 513 is formed on both surfaces of the first substrate layer 511, and more specifically, the first connecting line 514 is extended from the first electrode 520 and disposed on one surface 511*a* of the first substrate layer 511 facing the other surface 512*b* of the second substrate layer 512. On the contrary, the second connecting line 515 is formed on a different plane from the first connecting line 514. More specifically, the second connecting line 515 may be formed on the other surface 511*b* of the first substrate layer 511 to be electrically connected to the second electrode 540.

According to the drawing, a connection member 561 for connecting the drive unit to the first connecting line 514 and the second connecting line 515 is formed to cover both surfaces of the first substrate layer 511, respectively, to connect the second connecting line 515 to the drive unit on a plane different from that of the first connecting line 514. In this instance, the base substrate 517 is formed not to cover at least part of the second connecting line 515 located on the other surface of the first substrate layer 511.

In this manner, as a connection region is formed on both surfaces of the first substrate layer 511, the connection member 561 and the connecting line portion 513 may be connected to each other without any connecting through hole 418 (refer to FIG. 13C) in the embodiment of the invention described with reference to FIGS. 12, 13A, 13B and 13C.

According to the example, the surrounding structure of a connection region and the structure of a connection member in the foregoing embodiment of the invention have been modified and described, but the example may not be necessarily limited to this, and for example, may be applicable disclosure in a similar manner to the other embodiments of the invention.

Figure 15:
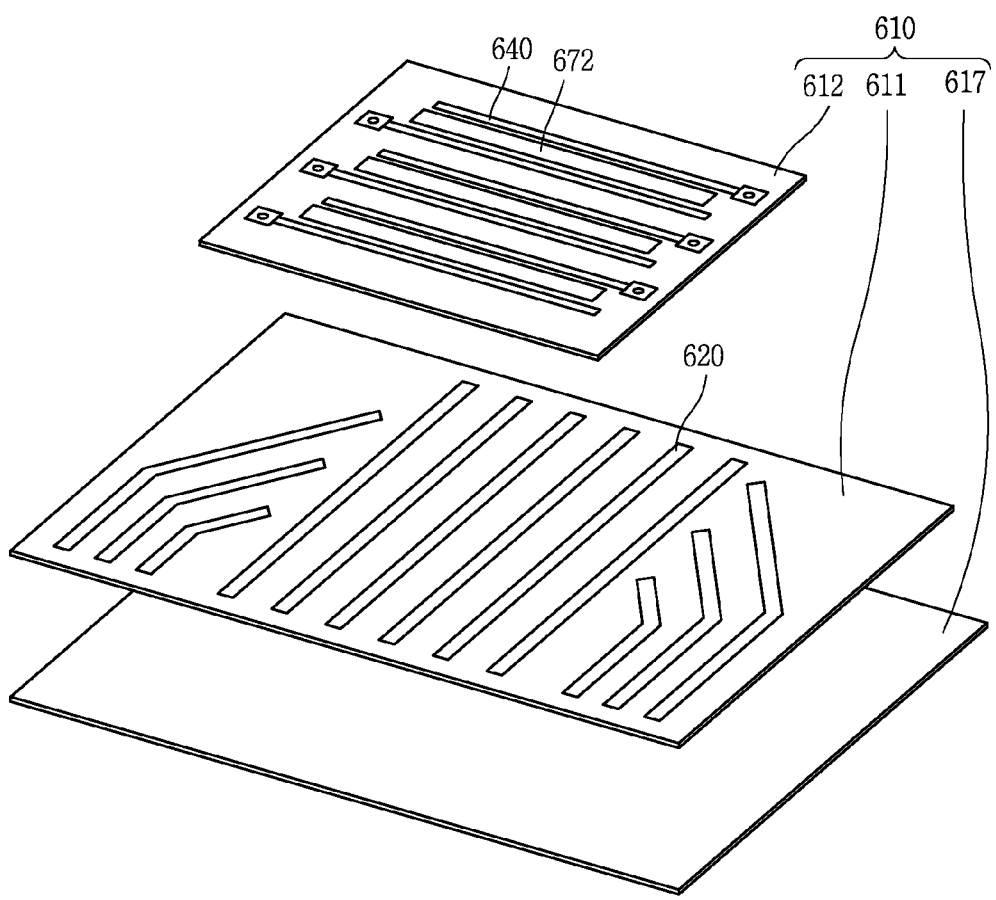
FIG. 15 is an exploded view illustrating the structure of connecting lines in a display device according to yet still another embodiment of the invention.
Figure 16A:
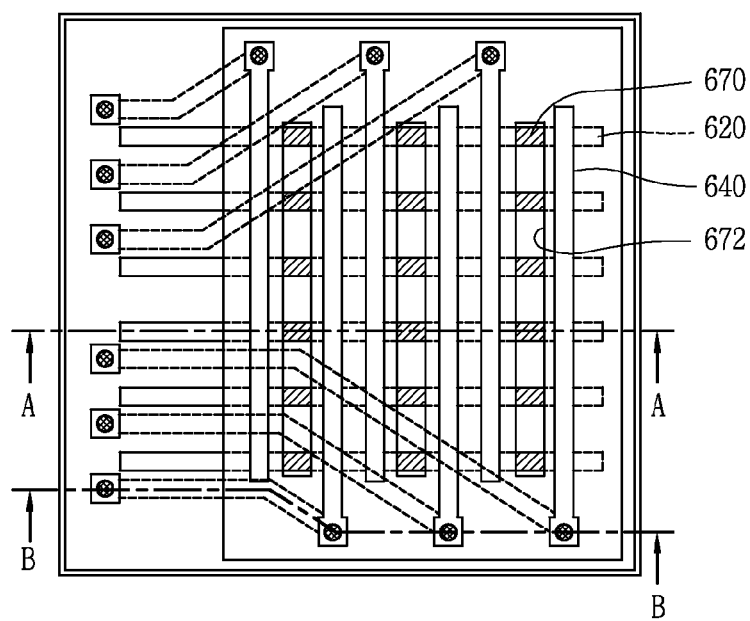
FIG. 16A is a plan view illustrating a display device in FIG. 15.
Figure 16B:
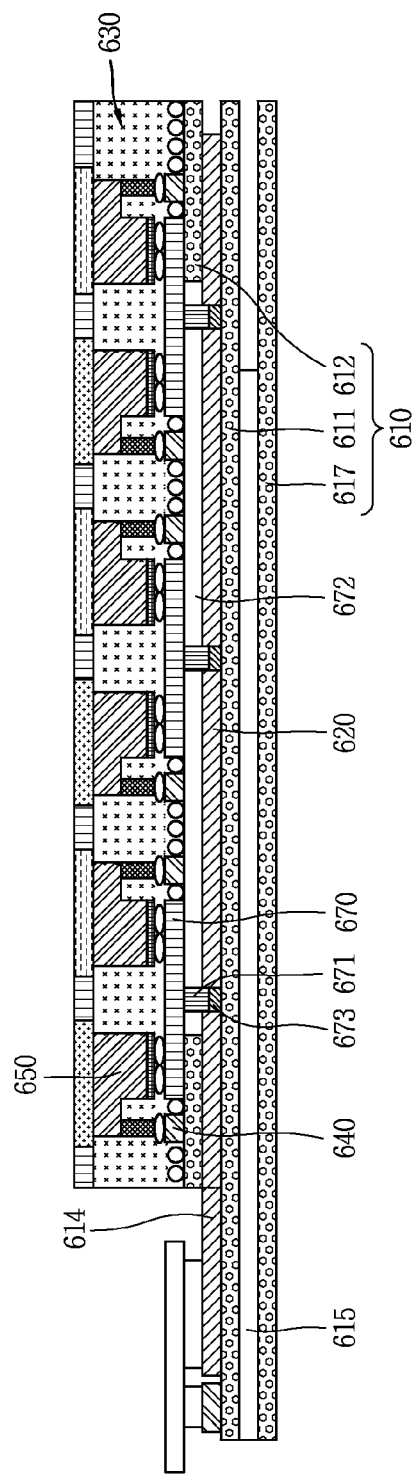

For another embodiment of the invention, FIG. 15 is an exploded view illustrating the structure of connecting lines in a display device according to yet still another embodiment of the invention, and FIG. 16A is a plan view illustrating a display device in FIG. 15, and FIGS. 16B and 16C are cross-sectional views taken along lines A-A and B-B, respectively, in FIG. 16A.

Referring to the drawings, a structure in which the surrounding portion of the electrode hole 471 (refer to FIG. 13B) is modified in the embodiment of the invention that has been described with reference to FIGS. 12, 13A, 13B and 13C. For example, a connecting hole 672 is disposed thereon instead of the electrode hole, and the connecting hole 672 is formed in parallel to the second electrode 640 and crossed with the first electrode 620.

An auxiliary electrode 670 is any one of a plurality of auxiliary electrodes, and the plurality of auxiliary electrodes are disposed within a single connecting hole 672. For example, the connecting hole 672 may be formed with a plurality of lines in parallel with the horizontal electrode (second electrode). Through this, a channel for electrically connecting the auxiliary electrode 670 to the first electrode 620 may be formed on the wiring substrate 610. In this instance, the wiring substrate 610 may be formed with a 3-layer structure, and as an example, the second substrate layer 612 is deposited on one surface of the first substrate layer 611, and the base substrate 617 is formed to cover the other surface of the first substrate layer 611. A channel for electrically connecting the auxiliary electrode 670 to the first electrode 620, namely, a connecting hole 672, is formed at the guide second substrate layer 612.

In the structure of FIGS. 12, 13A, 13B and 13C, electrode holes are disposed adjacent to each other to deteriorate the fabrication, but the connecting hole 672 is a line, thereby allowing a simple fabrication. Through this, it may be possible to have a fine pitch line structure.

The first electrode 620 may be formed to be disconnected from a plurality of portions to generate the auxiliary electrode 670 within the connecting hole 672, and an additional conductor 673 for plating may be disposed at the plurality of portions. Furthermore, the plurality of portions may be portions at which the connecting hole 672 is crossed with the second electrode 640. The conductor 673 may be formed on the plurality of portions by means of electroless plating. In other words, an additional conductor 673 may be formed at a portion from which the conductive line is disconnected, and through this, it may be possible to perform electroplating. In this instance, the auxiliary electrode 670 may be formed on one surface of the conductor 573 by electroplating.

The foregoing line structure may be also applicable to a vertical semiconductor light emitting device. Hereinafter, a display device implemented with the vertical semiconductor light emitting device will be described.

Figure 17:
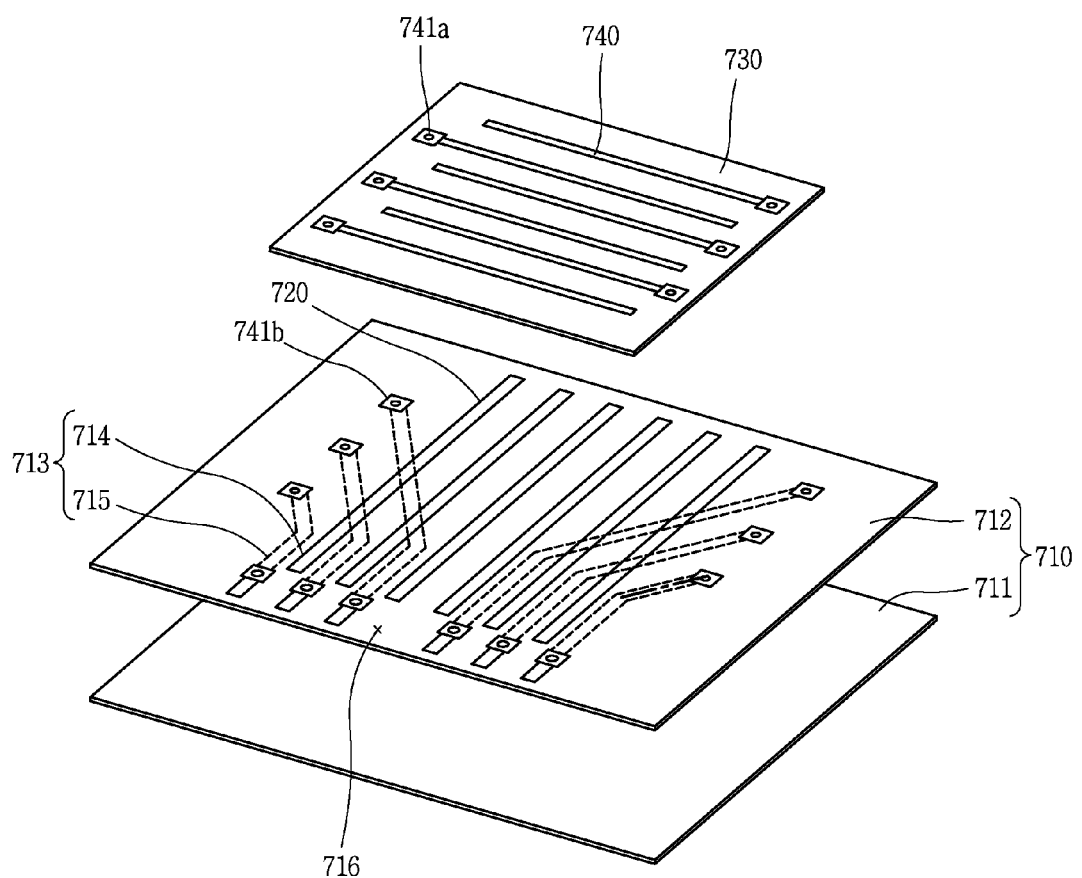
FIG. 17 is an exploded view illustrating the structure of connecting lines in a display device according to still yet another embodiment of the invention.
Figure 18A:
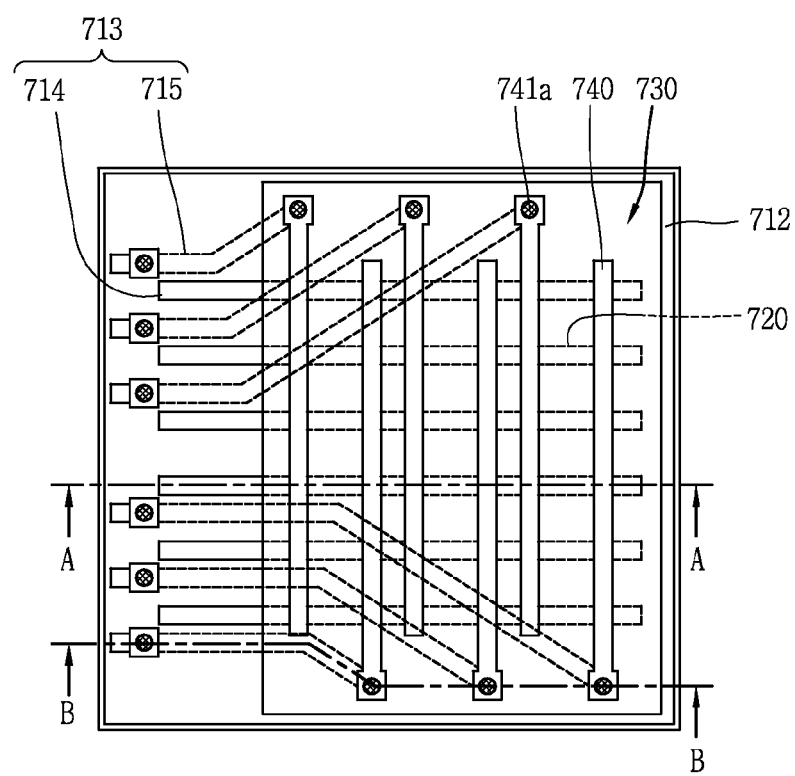
FIG. 18A is a plan view illustrating a display device in FIG. 12.
Figure 18B:
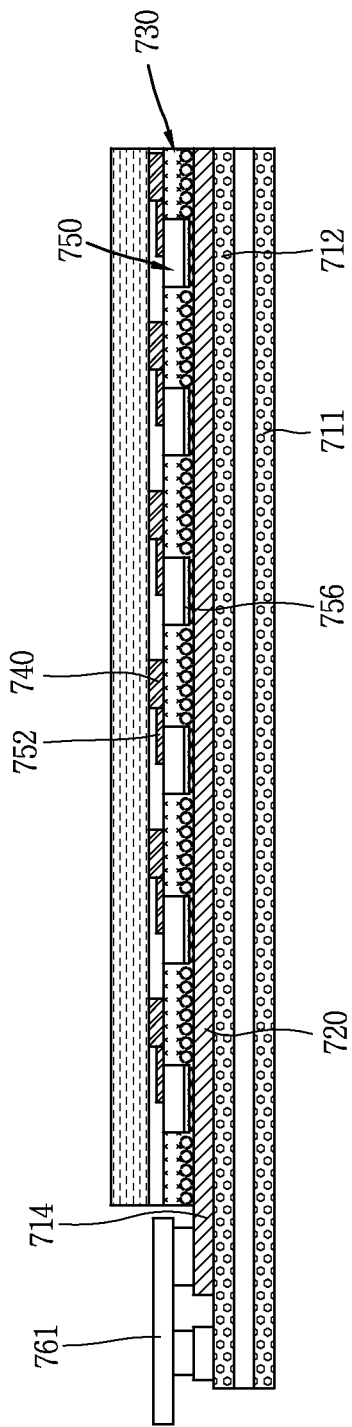
FIGS. 18B and 18C are cross-sectional views taken along lines A-A and B-B, respectively, in FIG. 18A.
Figure 18C:
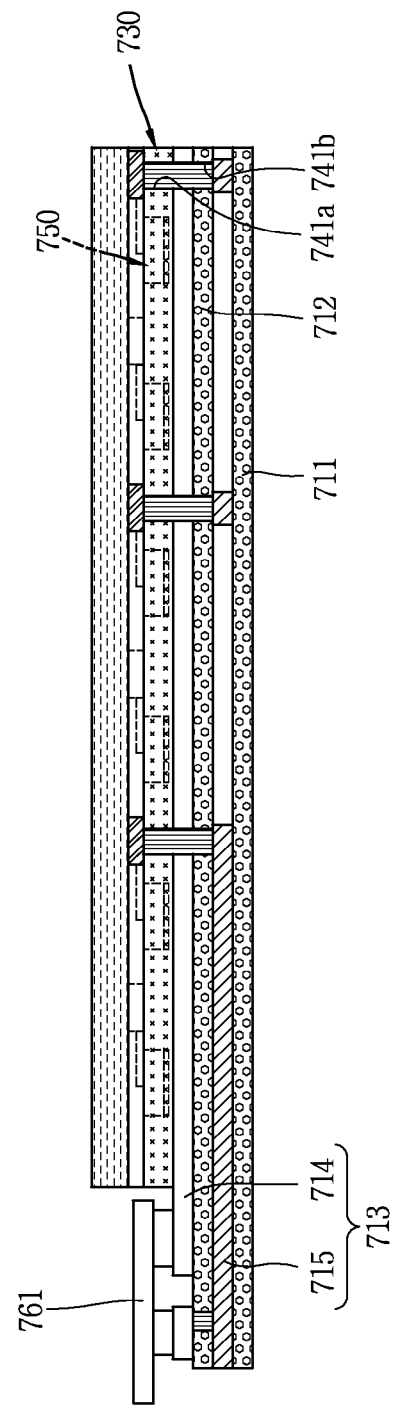

FIG. 17 is an exploded view illustrating the structure of connecting lines in a display device according to still yet another embodiment of the invention, and FIG. 18A is a plan view illustrating a display device in FIG. 12, and FIGS. 18B and 18C are cross-sectional views taken along lines A-A and B-B, respectively, in FIG. 18A.

Referring to the drawings, a display device 700 may include a wiring substrate 710, a conductive adhesive layer 730, and a semiconductor light emitting device 750.

The wiring substrate 710 may include a base layer 711 and a substrate layer 712. The wiring substrate 710 may be a substrate 210 (refer to FIG. 8) located with the first electrode described with reference to FIG. 8.

The base layer 711 and the substrate layer 712 are formed of an insulating and flexible material such as polyimide (PI) to implement a flexible display device. The first electrode 720 is disposed at the substrate layer 712, and the base layer 711 is formed to cover the first electrode 720.

The conductive adhesive layer 730 is formed on the substrate layer 712 located with the first electrode 720. The conductive adhesive layer 730 may be an anisotropic conductive film (ACF), an anisotropic conductive paste, a solution containing conductive particles, and the like, but hereinafter, it is illustrated an instance where the conductive adhesive layer 730 is implemented by an anisotropic conductive film.

The semiconductor light emitting device 750 may have a vertical structure, and coupled to the conductive adhesive layer 730. A plurality of second electrodes 740 disposed in a direction crossed with the length direction of the first electrode 720 and electrically connected to the semiconductor light emitting device 750 are located between the semiconductor light emitting devices. In this instance, the second electrode 740 is disposed at the conductive adhesive layer 730.

For example, the first electrode 720 and second electrode 740 may be disposed in a direction crossed with each other, and a p-type electrode 756 with a vertical structure may be connected to the first electrode 720, and an n-type electrode 752 may be connected to the second electrode 740. In this instance, as described in the foregoing embodiment of the invention, the first electrode 720 may be a vertical electrode, and the second electrode 740 may be a horizontal electrode. Accordingly, a horizontal electrode is formed on an upper surface of the conductive adhesive layer 730, and the semiconductor light emitting device 750 is disposed thereunder.

According to the drawing, a connecting line portion 713 for connecting the first electrode 720 and second electrode 740 to a drive unit of the plurality of semiconductor light emitting devices is formed at the substrate layer 712.

The connecting line portion 713 may include a first connecting line 714 and a second connecting line 715.

The first connecting line 714 is disposed on one surface of the substrate layer 712 facing the conductive adhesive layer 730, and extended along the length direction of the first electrode 720 from the first electrode. Accordingly, the first connecting line 714 may be arranged in the vertical direction. The first connecting line 714 is extended to a connection region 716 of the substrate layer 712, and connected to a connection member 761 in the connection region 716. The connection region 716 may be formed at one end portion of the substrate layer 712.

The second connecting line 715 is formed on the other surface of the substrate layer 712 and electrically connected to the second electrode 740 disposed at the conductive adhesive layer 730. A through hole 741a is formed at the conductive adhesive layer 730 to connect the second connecting line 715 to the second electrode 740. Furthermore, a through hole 741b corresponding to the through hole 741a is also formed at the substrate layer 712. The through holes 741a, 741b are formed by filling a conductive material in a via hole.

An upper surface of the conductive adhesive layer 730 is electrically connected to a lower surface of the substrate layer 712 via the through holes 741a, 741b, but other methods may be also available. For example, a conductive pad may be mounted on the through hole 741b of the substrate layer 712, and when heat and pressure are applied to the conductive adhesive layer 730, the conductive pad may be electrically connected to an end portion of the second electrode 740. According to the foregoing structure, the second electrode 740 may be electrically connected to the second connecting line 715 without forming a through hole of the conductive adhesive layer 730.

Referring to the drawings again, the second connecting line 715 is extended toward an inner portion of the wiring substrate 710 located with the first connecting line 714 from the through holes 741a, 741b. Through this, at least part of the first connecting line 714 and second connecting line 715 may be overlapped in the thickness direction of the wiring substrate, but may be disposed on different planes from each other.

The foregoing structure of the embodiment of the invention described with reference to FIGS. 12, 13A, 13B and 13C may be applicable to a specific structure of a connecting line portion on both surfaces of the substrate layer 712. In this manner, according to the embodiment of the invention, it may be possible to reduce the size of a bezel even in a display device to which a vertical type semiconductor light emitting device is applied.

The configurations and methods according to the above-described embodiments of the invention will not be applicable in a limited way to the foregoing display device using a semiconductor light emitting device, and all or part of each embodiment of the invention may be selectively combined and configured to make various modifications thereto.

What is claimed is:

1. A display device, comprising:
   a wiring substrate having a first substrate layer and a second substrate layer;
   a conductive adhesive layer configured to cover the wiring substrate; and
   a plurality of semiconductor light emitting devices coupled to the conductive adhesive layer, and electrically connected to a first electrode and a second electrode,
   wherein the first electrode is disposed at the first substrate layer, and
   the second substrate layer comprises one surface facing the conductive adhesive layer and the other surface covering the first electrode, and
   an auxiliary electrode electrically connected to the first electrode and the second electrode are disposed on one surface of the second substrate layer.

2. The display device of claim 1, wherein a connecting line portion for connecting the first and the second electrode to a drive unit of the plurality of semiconductor light emitting devices is formed on one surface of the first substrate layer facing the other surface of the second substrate layer.

3. The display device of claim 2, wherein the connecting line portion comprises:
   a first connecting line extended along the length direction of the first electrode from the first electrode; and
   a second connecting line electrically connected to the second electrode via a through hole on the first substrate layer, and extended in a direction crossed with the length direction of the second electrode.

4. The display device of claim 3, wherein the second connecting line comprises a left line and a right line disposed at both sides, respectively, around the first connecting line.

5. The display device of claim 1, wherein a connecting line portion for connecting the first and the second electrode to a drive unit of the plurality of semiconductor light emitting devices is formed on both surfaces of the first substrate layer.

6. The display device of claim 5, wherein the connecting line portion comprises:
   a first connecting line disposed on one surface of the first substrate layer facing the other surface of the second substrate layer; and
   a second connecting line formed on the other surface of the first substrate layer to be electrically connected to the second electrode.

7. The display device of claim 6, wherein at least part of the first and the second connecting line is disposed to be overlapped with each other in the thickness direction of the wiring substrate.

8. The display device of claim 7, wherein through holes corresponding to each other are formed on the first and the second substrate layer to electrically connect the second electrode to at least part of the second connecting line overlapped with the first connecting line.

9. The display device of claim 6, wherein a connecting through hole for extending the second connecting line to one surface of the first substrate layer is formed on the first substrate layer, and
   the second connecting line is connected to the drive unit on the same plane as that of the first connecting line via the connecting through hole.

10. The display device of claim 6, wherein a connection member for connecting the drive unit to the first and the second connecting line is formed to cover both surfaces of the first substrate layer so as to connect the second connecting line to the drive unit on a different plane from that of the first connecting line.

11. The display device of claim 6, wherein any one part of the second connecting line is extended in one direction and another part thereof is extended in the direction opposite to the one direction.

12. The display device of claim 6, wherein the wiring substrate further comprises a base substrate covering the other surface of the first substrate layer.

13. The display device of claim 1, wherein a connecting hole in parallel with the second electrode and crossed with the first electrode is disposed at the second substrate layer to form a channel for electrically connecting the auxiliary electrode to the first electrode.

14. The display device of claim 13, wherein the auxiliary electrode is any one of a plurality of auxiliary electrodes, and the plurality of auxiliary electrodes are disposed within a single connecting hole.

15. The display device of claim 13, wherein the first electrode is formed to be disconnected from a plurality of portions, and an additional conductor for plating is disposed at the plurality of portions.

16. The display device of claim 15, wherein the conductor is formed at the plurality of portions by electroless plating.

17. The display device of claim 16, wherein the auxiliary electrode is formed on one surface of the conductor by electroplating.

18. The display device of claim 1, wherein each of the plurality of semiconductor light emitting devices emits light of at least one of red light, green light, blue light and ultraviolet light.

19. The display device of claim 1, further comprising a phosphor layer to convert a predetermined light into at least one of red light, green light and blue light.

20. The display device of claim 1, wherein two adjacent semiconductor light emitting devices of the plurality of light emitting devices are electrically connected to the auxiliary electrode.

21. A display device, comprising:
   a wiring substrate having a base layer and a substrate layer;
   a conductive adhesive layer configured to cover the substrate layer; and
   a plurality of semiconductor light emitting devices coupled to the conductive adhesive layer, and electrically connected to a first electrode and a second electrode,
   wherein the first electrode is disposed at the substrate layer, and the second electrode is disposed at the conductive adhesive layer, and
   a connecting line portion for connecting the first and the second electrode to a drive unit of the plurality of semiconductor light emitting devices is formed at the substrate layer.

22. The display device of claim 21, wherein the connecting line portion comprises:
   a first connecting line disposed on one surface of the substrate layer facing the conductive adhesive layer, and extended from the first electrode; and
   a second connecting line formed on the other surface of the substrate layer and electrically connected to the second electrode.

23. The display device of claim 22, wherein a through hole for electrically connecting the second electrode to the second connecting line is formed on the conductive adhesive layer.

* * * * *